United States Patent
Zhang et al.

(10) Patent No.: US 11,789,573 B2
(45) Date of Patent: Oct. 17, 2023

(54) TOUCH DISPLAY PANEL, TOUCH DISPLAY DEVICE AND MANUFACTURING METHOD

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yuanqi Zhang, Beijing (CN); Tingliang Liu, Beijing (CN); Wei Wang, Beijing (CN); Yi Zhang, Beijing (CN); Fengli Ji, Beijing (CN); Chang Luo, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 180 days.

(21) Appl. No.: 17/298,087

(22) PCT Filed: Sep. 7, 2020

(86) PCT No.: PCT/CN2020/113675
§ 371 (c)(1),
(2) Date: May 28, 2021

(87) PCT Pub. No.: WO2022/047763
PCT Pub. Date: Mar. 10, 2022

(65) Prior Publication Data
US 2022/0317809 A1 Oct. 6, 2022

(51) Int. Cl.
G06F 3/044 (2006.01)
G06F 3/041 (2006.01)
H10K 59/40 (2023.01)

(52) U.S. Cl.
CPC .......... *G06F 3/0446* (2019.05); *G06F 3/0412* (2013.01); *G06F 3/0443* (2019.05);
(Continued)

(58) Field of Classification Search
CPC .... G06F 3/0446; G06F 3/0412; G06F 3/0443; G06F 2203/04112; G06F 3/04164; G06F 3/0448; H01L 27/323; H10K 59/40
See application file for complete search history.

(56) References Cited

U.S. PATENT DOCUMENTS

| | | | |
|---|---|---|---|
| 11,018,204 B1 | 5/2021 | Zhang et al. | |
| 2018/0129330 A1 | 5/2018 | Ding et al. | |

(Continued)

FOREIGN PATENT DOCUMENTS

| | | |
|---|---|---|
| CN | 107340917 A | 11/2017 |
| CN | 109032407 A | 12/2018 |

(Continued)

*Primary Examiner* — Sanjiv D. Patel
(74) *Attorney, Agent, or Firm* — The Webb Law Firm (57) ABSTRACT

The present disclosure provides a touch display panel, a touch display device and a manufacturing method. The touch display panel includes: a display substrate including a display area and a non-display area adjacent to the display area, wherein the non-display area includes a special-shaped area; and a touch electrode layer on the display substrate. The touch electrode layer includes a plurality of first electrodes and a plurality of second electrodes arranged in an array. The first electrodes are insulated from the second electrodes. The special-shaped area is an area that causes at least one of the plurality of first electrodes or at least one of the plurality of second electrodes to be incomplete. An orthographic projection of a part of the touch electrode layer on the display substrate overlaps with an orthographic projection of a part of the special-shaped area on the display substrate.

16 Claims, 9 Drawing Sheets

(52) U.S. Cl.
CPC ... *H10K 59/40* (2023.02); *G06F 2203/04103* (2013.01); *G06F 2203/04111* (2013.01)

(56) References Cited

U.S. PATENT DOCUMENTS

| | | |
|---|---|---|
| 2019/0138124 A1 | 5/2019 | Kim et al. |
| 2019/0265824 A1* | 8/2019 | Abe .................... G06F 3/0446 |
| 2020/0033997 A1 | 1/2020 | Wang et al. |
| 2020/0127233 A1* | 4/2020 | Sung ................... H10K 77/111 |
| 2020/0243610 A1* | 7/2020 | Han ..................... H10K 50/86 |
| 2020/0264715 A1* | 8/2020 | Eom .................... G06F 3/044 |

FOREIGN PATENT DOCUMENTS

| | | |
|---|---|---|
| CN | 109445633 A | 3/2019 |
| CN | 109725772 A | 5/2019 |
| CN | 109859648 A | 6/2019 |
| CN | 111026294 A | 4/2020 |

* cited by examiner

TOUCH DISPLAY PANEL, TOUCH DISPLAY DEVICE AND MANUFACTURING METHOD

CROSS-REFERENCE TO RELATED APPLICATION

The present application is a U.S. National Stage Application under 35 U.S.C. § 371 of International Patent Application No. PCT/CN2020/113675, filed on Sep. 7, 2020, the disclosure of which incorporated by reference herein in its entirety.

TECHNICAL FIELD

The present disclosure relates to a touch display panel, a touch display device and a manufacturing method.

BACKGROUND

In a touch panel, transmitting (Tx) electrodes and receiving (Rx) electrodes are crossingly arranged on the panel in mutually orthogonal directions to implement detecting a touch position. In the electrode layout solution of the Flexible Multiple Layer on Cell (FMLOC) technology, the Tx electrodes and the Rx electrodes are arranged in the same layer. The Tx electrodes and the Rx electrodes form electrode pattern units, so that the touch position is determined by monitoring the change in the electrical parameters of the electrode pattern units.

SUMMARY

According to an aspect of embodiments of the present disclosure, a touch display panel is provided. The touch display panel comprises: a display substrate comprising a display area and a non-display area adjacent to the display area, wherein the non-display area comprises a special-shaped area; and a touch electrode layer on the display substrate and located in the display area, wherein the touch electrode layer comprises a plurality of first electrodes and a plurality of second electrodes arranged in an array, the plurality of first electrodes being insulated from the plurality of second electrodes, wherein the special-shaped area is an area that causes at least one of the plurality of first electrodes or at least one of the plurality of second electrodes to be incomplete, and an orthographic projection of a part of the touch electrode layer on the display substrate overlaps with an orthographic projection of a part of the special-shaped area on the display substrate.

In some embodiments, the non-display area comprises a first non-display area on at least one side of the display area, and the special-shaped area comprises a first special-shaped area in the first non-display area; wherein the part of the touch electrode layer comprises a first portion extending into the first special-shaped area, an orthographic projection of the first portion on the display substrate overlapping with an orthographic projection of a part of the first special-shaped area on the display substrate.

In some embodiments, the non-display area comprises a second non-display area inside the display area, and the special-shaped area comprises a second special-shaped area in the second non-display area; wherein the part of the touch electrode layer comprises a second portion extending into the second special-shaped area, an orthographic projection of the second portion on the display substrate overlapping with an orthographic projection of a part of the second special-shaped area on the display substrate.

In some embodiments, the first special-shaped area is located at an arc-shaped corner portion of the display substrate.

In some embodiments, the second special-shaped area comprises a through hole that penetrates through the display substrate or a blind hole that does not penetrate through the display substrate.

In some embodiments, the display substrate comprises: a base substrate; a device structure layer on a side of the base substrate and comprising a plurality of transistors; a planarization layer on a side of the device structure layer away from the base substrate; a plurality of third electrodes on a side of the planarization layer away from the device structure layer, wherein the plurality of third electrodes are in the display area, and the plurality of third electrodes are electrically connected to different transistors in the plurality of transistors; a pixel defining layer on a side of the planarization layer away from the device structure layer, wherein the pixel defining layer has a plurality of openings, the pixel defining layer is in the display area and at least a portion of the special-shaped area, one of the plurality of openings of the pixel defining layer in the display area exposes at least a portion of at least one of the plurality of third electrodes, and one of the plurality of openings of the pixel defining layer in the at least a portion of the special-shaped area exposes a part of the planarization layer; a functional layer in each of the plurality of openings of the pixel defining layer; a fourth electrode on a side of the functional layer away from the base substrate; and an encapsulation layer on a side of the fourth electrode away from the functional layer; wherein the touch electrode layer is on a side of the encapsulation layer away from the base substrate.

In some embodiments, each of the plurality of first electrodes comprises a first electrode line, an orthographic projection of the first electrode line on the base substrate being between orthographic projections of different openings of the pixel defining layer on the base substrate; and each of the plurality of second electrodes comprises a second electrode line, an orthographic projection of the second electrode line on the base substrate being between orthographic projections of different openings of the pixel defining layer on the base substrate.

In some embodiments, the part of the touch electrode layer comprises: at least one of a part of the first electrode line extending into the special-shaped area or a part of the second electrode line extending into the special-shaped area.

In some embodiments, the plurality of first electrodes comprise a plurality of columns of first electrodes arranged along a first direction, wherein adjacent first electrodes in each column of the plurality of columns of first electrodes are electrically connected; and the plurality of second electrodes comprise a plurality of rows of second electrodes arranged along a second direction, wherein adjacent second electrodes in each row of the plurality of rows of second electrodes are electrically connected; wherein the first direction intersects with the second direction.

In some embodiments, the first non-display area comprises a first sub-area on a side of the display area, a second sub-area on a side of the display area adjacent to the first sub-area, a third sub-area on a side of the display area opposite to the first sub-area and a fourth sub-area on a side of the display area opposite to the second sub-area, wherein the third sub-area and the fourth sub-area form a first included angle, the first sub-area and the second sub-area form a second included angle, and a distance between the second special-shaped area and the first included angle is less than a distance between the second special-shaped area and the second included angle.

In some embodiments, the touch display panel further comprises: a plurality of first wires electrically connected to the plurality of columns of first electrodes in a one-to-one correspondence and located at least in the second sub-area and the third sub-area, wherein a first wire in the plurality of first wires that corresponds to a column of first electrodes closest to the second sub-area is closest to the display area; and a plurality of second wires electrically connected to the plurality of rows of second electrodes in a one-to-one correspondence and located at least in the fourth sub-area, wherein a second wire in the plurality of second wires that corresponds to a row of second electrodes closest to the first sub-area is closest to the display area.

In some embodiments, a part that occupies a smallest area in the plurality of first wires or the plurality of second wires is at a position of the first included angle.

In some embodiments, the plurality of first electrodes and the plurality of second electrodes constitute a plurality of electrode patterns, and the plurality of electrode patterns comprises a first electrode pattern, a third electrode pattern and a fifth electrode pattern which are incomplete and adjacent to the special-shaped area, wherein the first electrode pattern, the third electrode pattern, and the fifth electrode pattern are adjacent to the third sub-area and extend into the third sub-area, wherein the first electrode pattern extends 200 micrometers to 250 micrometers toward the third sub-area, the third electrode pattern extends 100 micrometers to 180 micrometers toward the third sub-area, and the fifth electrode pattern extends 300 micrometers to 380 micrometers toward the third sub-area.

In some embodiments, a ratio between a distance between adjacent first wires in the plurality of first wires that are in the third sub-area and a width of a portion of at least one of the first electrode pattern, the third electrode pattern, or the fifth electrode pattern extending into the third sub-area is 0.03 to 0.17.

According to another aspect of the embodiments of the present disclosure, a touch display device is provided. The touch display device comprises the touch display panel described above.

According to another aspect of the embodiments of the present disclosure, a manufacturing method for a touch display panel is provided. The manufacturing method comprises: providing a display substrate, wherein the display substrate comprises a display area and a non-display area adjacent to the display area, the non-display area comprising a special-shaped area; and forming a touch electrode layer on the display substrate, wherein the touch electrode layer is in the display area, and the touch electrode layer comprises a plurality of first electrodes and a plurality of second electrodes arranged in an array, the plurality of first electrodes being insulated from the plurality of second electrodes, wherein the special-shaped area is an area that causes at least one of the plurality of first electrodes or at least one of the plurality of second electrodes to be incomplete, and an orthographic projection of a part of the touch electrode layer on the display substrate overlaps with an orthographic projection of a part of the special-shaped area on the display substrate.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate embodiments of the present disclosure and, together with this specification, serve to explain the principles of the present disclosure.

The present disclosure may be more clearly understood from the following detailed description with reference to the accompanying drawings, in which.

It should be understood that the dimensions of the various parts shown in the accompanying drawings are not drawn according to the actual scale. In addition, the same or similar reference signs are used to denote the same or similar components.

DETAILED DESCRIPTION

Various exemplary embodiments of the present disclosure will now be described in detail in conjunction with the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include", or the like means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (comprising technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

Figure 1:
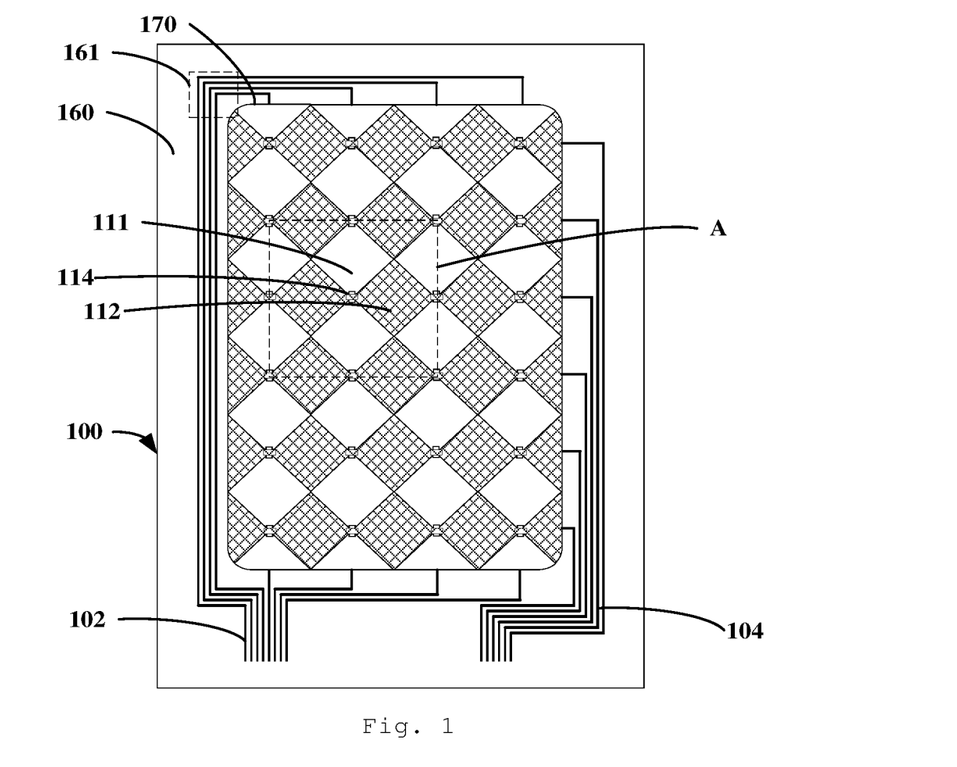
FIG. 1 is a top view schematically showing a touch display panel in the related art.

FIG. 1 is a top view schematically showing a touch display panel in the related art.

As shown in FIG. 1, the touch display panel comprises a display substrate 100. The display substrate 100 comprises a display area 170 and a non-display area 160 adjacent to the display area. For example, the non-display area 160 comprises a special-shaped area 161. The special-shaped area 161 is located at a position adjacent to a round corner of the display area. In addition, FIG. 1 also shows a touch electrode and a conductive bridge 114. The touch electrode comprises a first electrode 111 and a second electrode 112. A first peripheral wire 102 is electrically connected to the first electrode 111, and a second peripheral wire 104 is electrically connected to the second electrode 112.

It should be noted that the "special-shaped area" in the embodiments of the present disclosure refers to an area that causes an electrode pattern (described below) of the touch electrode to be incomplete. For example, the special-shaped area may comprise a round corner area or a cutout area.

Figure 2:
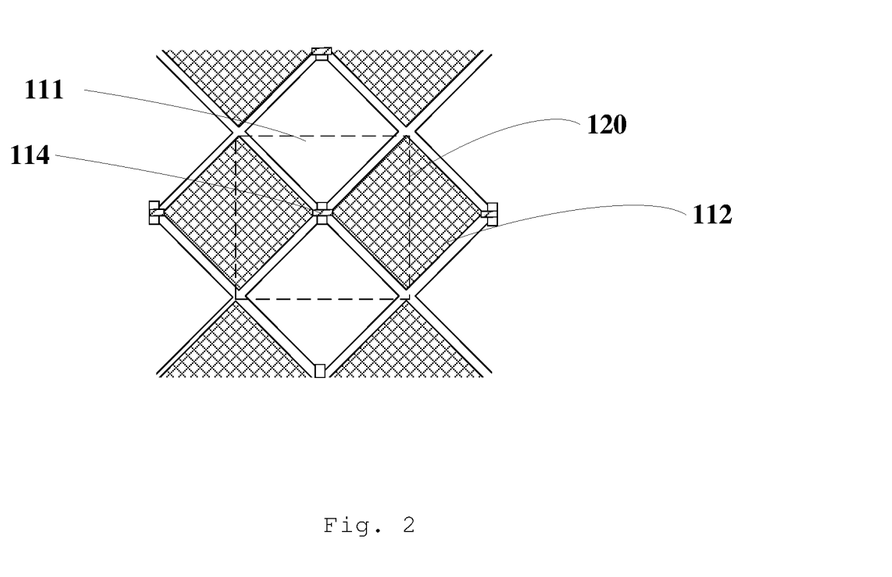
FIG. 2 is a partially enlarged view schematically showing a structure of the touch display panel in the related art at a block A in FIG. 1.

FIG. 2 is a partially enlarged view schematically showing a structure of the touch display panel in the related art at a block A in FIG. 1. As shown in FIG. 2, the first electrode 111 and the second electrode 112 constitute an electrode pattern 120. A change in an electrical parameter (e.g., a capacitance value) of the electrode pattern 120 may be monitored to determine a touch position. Generally, inmost areas of the screen display, the electrode pattern is complete.

Figure 3:
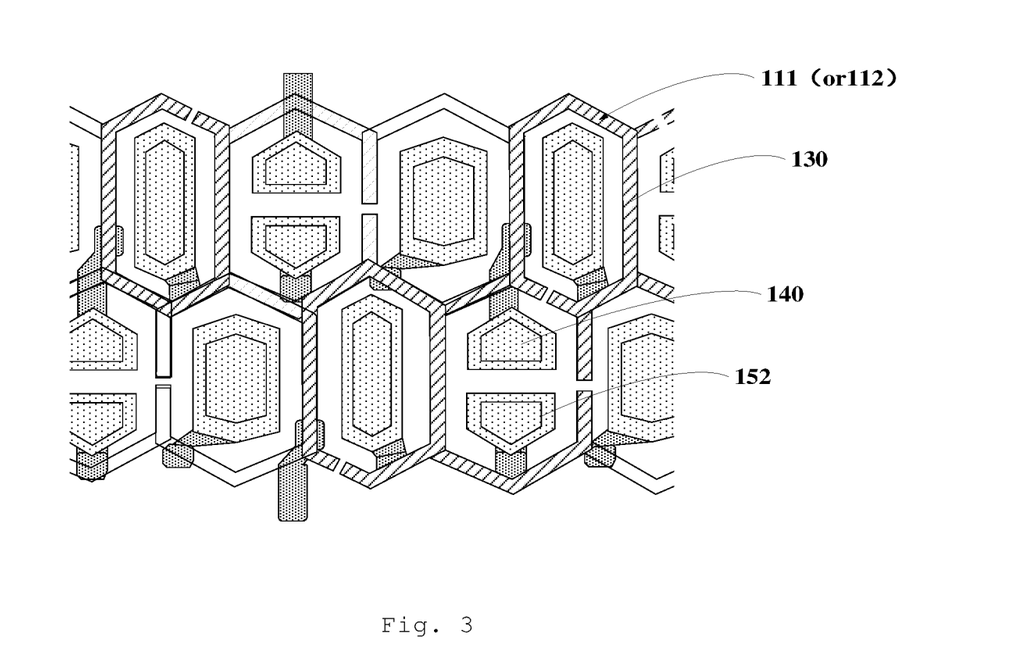
FIG. 3 is a schematic view schematically showing a structure of a touch electrode in the related art.

FIG. 3 is a schematic view schematically showing a structure of a touch electrode in the related art.

FIG. 3 shows a trace 130 of the touch electrode (e.g., the first electrode 111 or the second electrode 112). The trace 130 of the touch electrode is arranged in the gap between sub-pixels of different colors. In addition, FIG. 3 also shows an anode 140 of a light emitting device of the sub-pixel and an opening 152 of a pixel defining layer.

Figure 4:
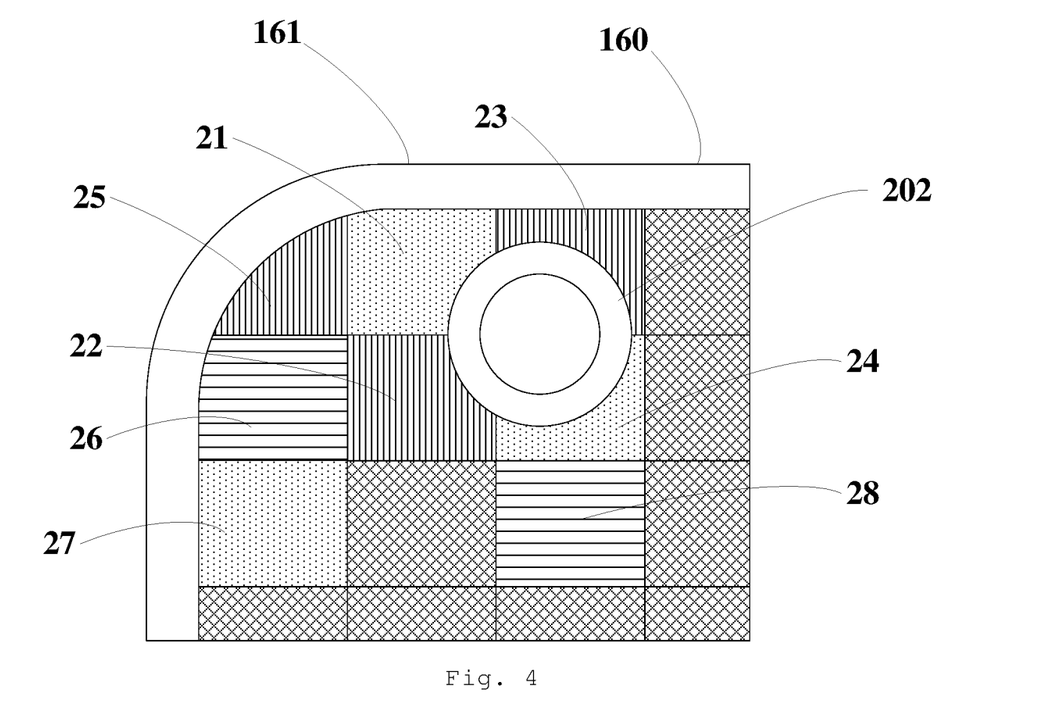
FIG. 4 is a partial schematic view schematically showing the touch display panel in the related art.

FIG. 4 is a partial schematic view schematically showing the touch display panel in the related art.

Different electrode patterns 21 to 28 are shown in FIG. 4. The non-display area 160 has the special-shaped area 161. The special-shaped area 161 may cause the electrode patterns 21, 25, and 26 to be incomplete. In addition, in some embodiments, the non-display area 160 may also have a special-shaped area 202. For example, the special-shaped area 202 may be a cutout hole. The special-shaped area 202 causes the electrode patterns 21, 22, 23, and 24 to be incomplete.

Therefore, the electrode pattern might be incomplete in the display area adjacent to a round corner or a cutout area of the non-display area. The inventors of the present disclosure have found that a completeness of the electrode pattern may affect an electrical parameter (e.g., a capacitance value) of the electrode pattern. For example, when the completeness of the electrode pattern is less than 70%, the touch performance becomes worse; when the completeness of the electrode pattern is lower, the performance requirements for touch control may not be met. As shown in FIG. 4, the electrode pattern 28 is a complete electrode pattern. The electrode patterns 21 to 25 at the round corner area and the cutout area are both incomplete. In particular, the completeness of the electrode patterns 23, 24, and 25 is the worst. Generally, for such screen with a cutout hole in the display area, the completeness of the electrode patterns at the cutout position and the round corner proximate thereto is the worst.

As the appearance of the display screen in related technologies becomes more and more diversified, the special-shaped screens are also increased. The completeness of the electrode patterns at the special-shaped area of the screen might be poor (e.g., the electrode patterns 21 to 26 shown in FIG. 4), thereby affecting the touch performance of the screen.

In view of this, the embodiments of the present disclosure provide a touch display panel to improve the touch performance of the touch display panel proximate to the special-shaped area.

Figure 5A:
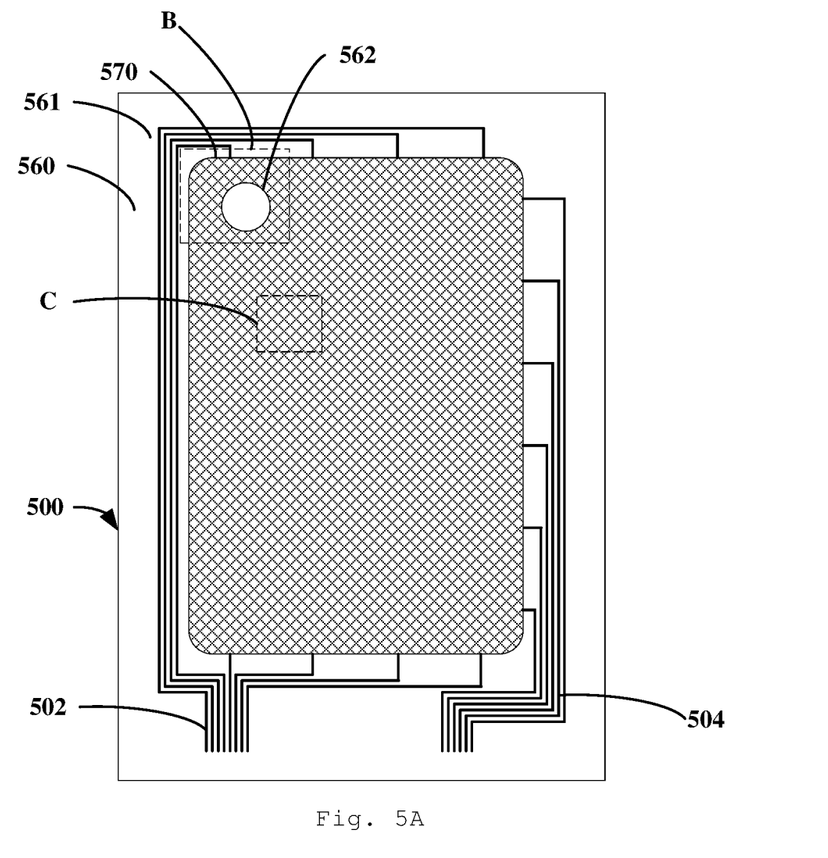
FIG. 5A is a top view schematically showing a touch display panel according to an embodiment of the present disclosure.
Figure 5B:
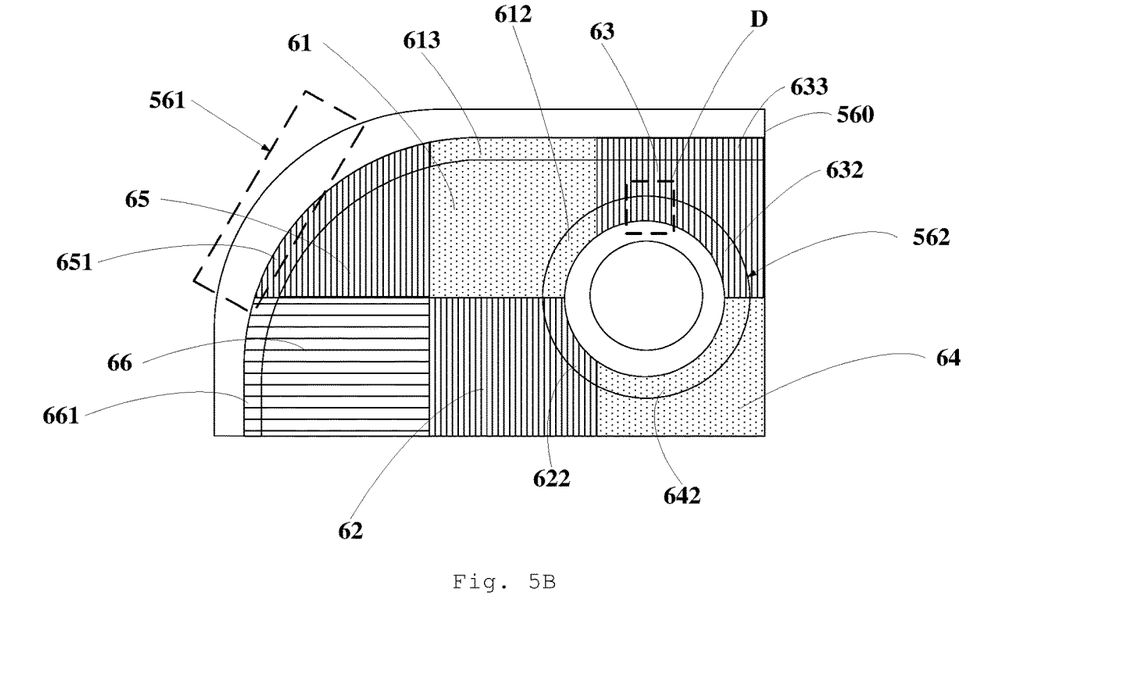
FIG. 5B is a partially enlarged view schematically showing a structure of a touch display panel at a block B in FIG. 5A according to an embodiment of the present disclosure.
Figure 5C:
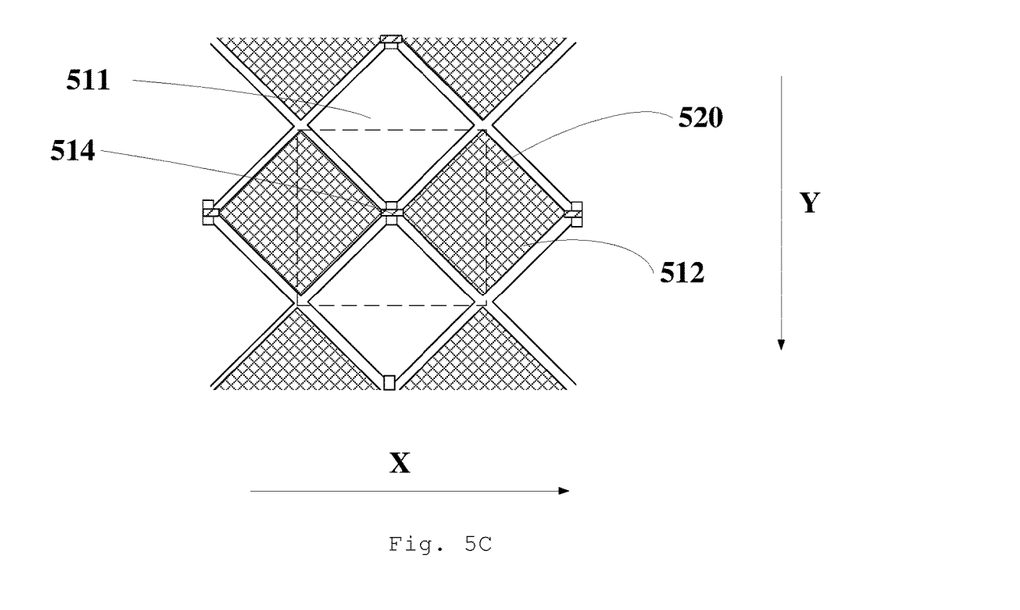
FIG. 5C is a partially enlarged view schematically showing a structure of a touch display panel at a block C in FIG. 5A according to an embodiment of the present disclosure.

FIG. 5A is a top view schematically showing a touch display panel according to an embodiment of the present disclosure. FIG. 5B is a partially enlarged view schematically showing a structure of a touch display panel at a block B in FIG. 5A according to an embodiment of the present disclosure. FIG. 5C is a partially enlarged view schematically showing a structure of a touch display panel at a block C in FIG. 5A according to an embodiment of the present disclosure.

As shown in FIG. 5A, the touch display panel comprises a display substrate 500. The display substrate 500 comprises a display area 570 and a non-display area 560 adjacent to the display area 570. The non-display area 560 comprises a special-shaped area (e.g., a special-shaped area 561 or 562).

As shown in FIGS. 5A and 5C, the touch display panel comprises a touch electrode layer on the display substrate 500 and located in the display area. The touch electrode layer comprises a plurality of first electrodes 511 and a plurality of second electrodes 512 arranged in an array. The plurality of first electrodes 511 are insulated from the plurality of second electrodes 512. The first electrode 511 and the second electrode 512 constitute an electrode pattern 520. In some embodiments, the touch display panel further comprises: a plurality of first wires 502 electrically connected to a plurality of columns of first electrodes 511 in a one-to-one correspondence, and a plurality of second wires 504 electrically connected to a plurality of rows of second electrodes 512 in a one-to-one correspondence.

In some embodiments, as shown in FIG. 5C, the plurality of first electrodes 511 comprise a plurality of columns of first electrodes arranged along a first direction Y. Adjacent first electrodes in each column of first electrodes are electrically connected. The plurality of second electrodes 512 comprise a plurality of rows of second electrodes arranged along a second direction X. Adjacent second electrodes in each row of second electrodes are electrically connected. For example, the adjacent second electrodes 512 in the same row are electrically connected by a conductive bridges 514. The first direction Y intersects with the second direction X. For example, the first direction Y is perpendicular to the second direction X.

For example, the first electrode 511 is in the same film layer as the second electrode 512. Materials of the first electrode 511 and the second electrode 512 may comprise a titanium/aluminum/titanium (Ti/Al/Ti) material. The second electrodes 512 are connected by the conductive bridge 514 at a position where the first electrode 511 crosses with the second electrode 512. The conductive bridge 514 is in another film layer. A material of the conductive bridge may comprise titanium/aluminum/titanium. There is an insulating layer between the film layer where the conductive bridge is located and the film layer where the electrode is located.

As mentioned above, the completeness of the electrode pattern may affect the electrical parameters of the electrode pattern. For example, FIG. 5B shows a first electrode pattern 61, a second electrode pattern 62, a third electrode pattern 63, a fourth electrode pattern 64, a fifth electrode pattern 65, and a sixth electrode pattern 66 which are incomplete. As shown in FIG. 5B, one special-shaped area 562 causes the electrode patterns 61 to 64 to be incomplete, and another special-shaped area 561 causes the electrode patterns 65 and 66 to be incomplete.

In some embodiments of the present disclosure, the above-described special-shaped area is an area that causes at least one of the plurality of first electrodes or at least one of the plurality of second electrodes to be incomplete. A part of the touch electrode layer extends into the special-shaped area. An orthographic projection of the part of the touch electrode layer on the display substrate 500 overlaps with an orthographic projection of a part of the special-shaped area on the display substrate 500. For example, as shown in FIG. 5B, a part 651 of the fifth electrode pattern 65 in the touch electrode layer extends into the special-shaped area 561, and an orthographic projection of the part 651 on the display substrate 500 overlaps with an orthographic projection of a part of the special-shaped area 561 on the display substrate 500.

So far, the touch display panel according to some embodiments of the present disclosure is provided. The touch display panel comprises: a display substrate comprising a display area and a non-display area adjacent to the display area, wherein the non-display area comprises a special-shaped area; and a touch electrode layer on the display substrate and located in the display area. The touch electrode layer comprises a plurality of first electrodes and a plurality of second electrodes arranged in an array. The plurality of first electrodes are insulated from the plurality of second electrodes. A part of the touch electrode layer extends into the special-shaped area, and an orthographic projection of the part of the touch electrode layer on the display substrate overlaps with an orthographic projection of a part of the special-shaped area on the display substrate. By extending a part of the touch electrode layer into the special-shaped area, it is possible to increase an area of an incomplete electrode pattern, and improve the completeness of the incomplete electrode pattern, thereby improving the touch performance of the touch display panel in the vicinity of the special-shaped area.

In some embodiments, as shown in FIGS. 5A and 5B, the non-display area 560 comprises a first non-display area on at least one side of the display area. For example, the first non-display area surrounds the display area. The special-shaped area may comprise a first special-shaped area 561 in the first non-display area. For example, the first special-shaped area 561 is located at an arc-shaped corner portion of the display substrate. The part of the touch electrode layer comprises a first portion extending into the first special-shaped area. An orthographic projection of the first portion on the display substrate 500 overlaps with an orthographic projection of a part of the first special-shaped area 561 on the display substrate 500.

For example, as shown in FIG. 5B, the part of the touch electrode layer comprises first portions 651 and 661 extending into the first special-shaped area 561. The first portion 651 is a portion of the fifth electrode pattern 65 extending into the first special-shaped area 561. An orthographic projection of the first portion 651 on the display substrate 500 overlaps with an orthographic projection of a part of the first special-shaped area 561 on the display substrate 500. Another first portion 661 is a portion of the sixth electrode pattern 66 extending into the first special-shaped area 561. An orthographic projection of the first portion 661 on the display substrate 500 overlaps with an orthographic projection of another portion of the first special-shaped area 561 on the display substrate 500.

In the above-described embodiments, a part of the touch electrode layer extends into the first special-shaped area, so that it is possible to increase an area of an incomplete electrode pattern, and improve the completeness of the incomplete electrode pattern, thereby improving the touch performance of the touch display panel in the vicinity of the special-shaped area.

In some embodiments, as shown in FIGS. 5A and 5B, the non-display area 560 comprises a second non-display area inside the display area 570. The special-shaped area comprises a second special-shaped area 562 in the second non-display area. For example, the second special-shaped area 562 comprises a through hole that penetrates through the display substrate or a blind hole that does not penetrate through the display substrate. The part of the touch electrode layer further comprises a second portion extending into the second special-shaped area 562. An orthographic projection of the second portion on the display substrate 500 overlaps with an orthographic projection of a part of the second special-shaped area 562 on the display substrate 500.

For example, as shown in FIG. 5B, the part of the touch electrode layer further comprises second portions 612, 622, 632 and 642 extending into the second special-shaped area 562. The second portions 612, 622, 632, and 642 are the portions of the electrode patterns 61, 62, 63, and 64 extending into the second special-shaped area 562 respectively. Taking the second portion 612 as an example, an orthographic projection of the second portion 612 on the display substrate 500 overlaps with an orthographic projection of a part of the second special-shaped area 562 on the display substrate 500.

In the above-described embodiments, a part of the touch electrode layer extends into the second special-shaped area, so that it is possible to increase an area of the incomplete electrode pattern, and improve the completeness of the incomplete electrode pattern, thereby improving the touch performance of the touch display panel in the in the vicinity of the second special-shaped area.

In other embodiments, for the incomplete electrode patterns located at the edge of the display area which are caused by the second special-shaped area, these electrode patterns may also extend into the first non-display area in addition to extending into the second special-shaped area. For example, as shown in FIG. 5B, the first electrode pattern 61 also has a portion 613 extending into the first non-display area in addition to having the second portion 612 extending into the second special-shaped area; the electrode pattern 63 also has a portion 633 extending into the first non-display area in addition to having the second portion 632 extending into the second special-shaped area. In this way, it is possible to further enlarge an area of these electrode patterns, thereby further improving the completeness of these electrode patterns.

In other embodiments, for the incomplete electrode patterns located at the edge of the display area which are caused by the second special-shaped area, these electrode patterns may also only extend into the first non-display area without extending into the second special-shaped area.

It should be noted that although FIG. 5B shows the first special-shaped area and the second special-shaped area, the scope of the touch display panel in the embodiments of the present disclosure is not limited to this. For example, in some embodiments, the touch display panel may only comprise one of the first special-shaped area or the second special-shaped area. In this way, the above-described technical solution may be implemented for one of the first special-shaped area or the second special-shaped area.

Figure 6:
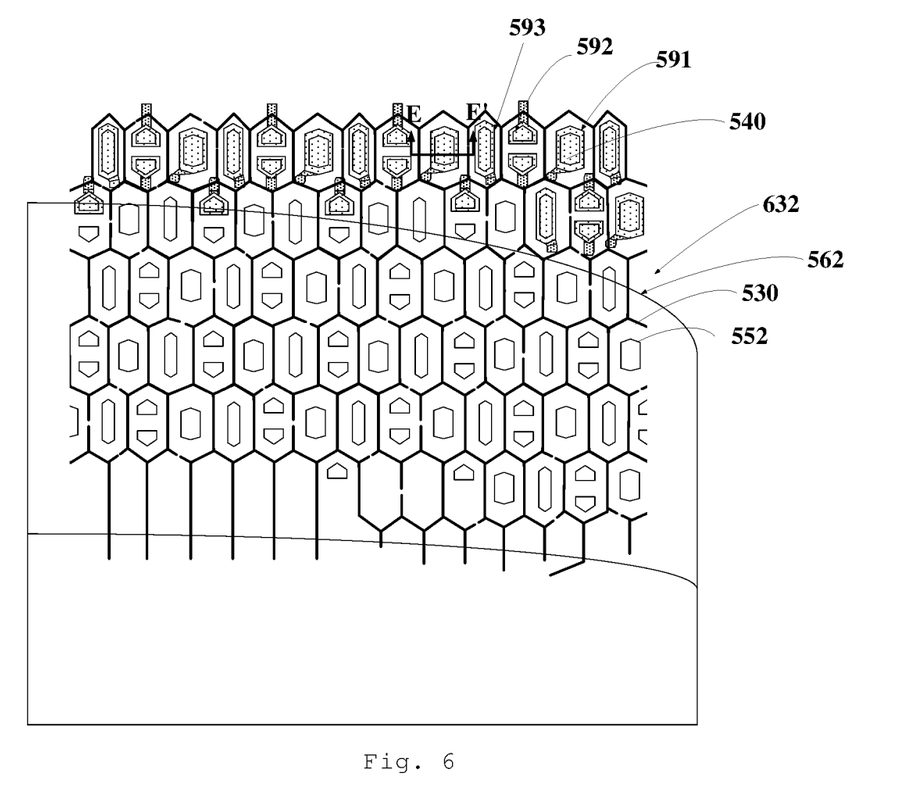
FIG. 6 is a partially enlarged view schematically showing a structure of a touch display panel at a block D in FIG. 5B according to an embodiment of the present disclosure.

FIG. 6 is a partially enlarged view schematically showing a structure of a touch display panel at a block D in FIG. 5B according to an embodiment of the present disclosure. FIG. 6 shows a first sub-pixel 591, a second sub-pixel 592, and a third sub-pixel 593. For example, the first sub-pixel 591 is a blue sub-pixel, the second sub-pixel 592 is a green sub-pixel, and the third sub-pixel 593 is a red sub-pixel. In addition, FIG. 6 also shows a third electrode (e.g., an anode) 540 of a light emitting device of the sub-pixel.

As shown in FIG. 6, each of the plurality of first electrodes comprises a first electrode line 530. An orthographic projection of the first electrode line 530 on a base substrate (described later) is between orthographic projections of different openings 552 of a pixel defining layer on the base substrate. Similarly, each of the plurality of second electrodes comprises a second electrode line (the second electrode line is similar to the first electrode line 530). An orthographic projection of the second electrode line on the base substrate is between orthographic projections of different openings of the pixel defining layer on the base substrate. In this way, it is possible to avoid as much as possible that the light emission of the sub-pixels is blocked by the first electrode line or the second electrode line.

As shown in FIG. 6, the first electrode line and the second electrode line forms a plurality of meshes. In order to achieve the purposes such as the insulation between the first electrode line and the second electrode, the mesh may comprise a notch. In some embodiments, the part of the touch electrode layer extending to the special-shaped area comprises at least a complete mesh, and the touch electrode layer adjacent to another part of the non-display area (i.e., a part of the non-display area other than the special-shaped area) may not have a complete mesh extending outside the display area.

In some embodiments, as shown in FIG. 6, the part of the touch electrode layer extending into the special-shaped area comprises: at least one of a portion of the first electrode line extending into the special-shaped area or a portion of the second electrode line extending into the special-shaped area.

In some embodiments, as shown in FIG. 6, there is no third electrode (e.g., an anode) 540 in the area where the first electrode or the second electrode is extended, but an opening of the pixel defining layer (which may be referred to as a dummy PDL (Pixel Defining Layer) opening). In this way, the opening of the pixel defining layer at the boundary of the display area is not affected by the nearby special-shaped area, so that it is possible to improve the completeness of the opening of the pixel defining layer in the display area, thereby improving the display effect of the display screen.

Figure 7:
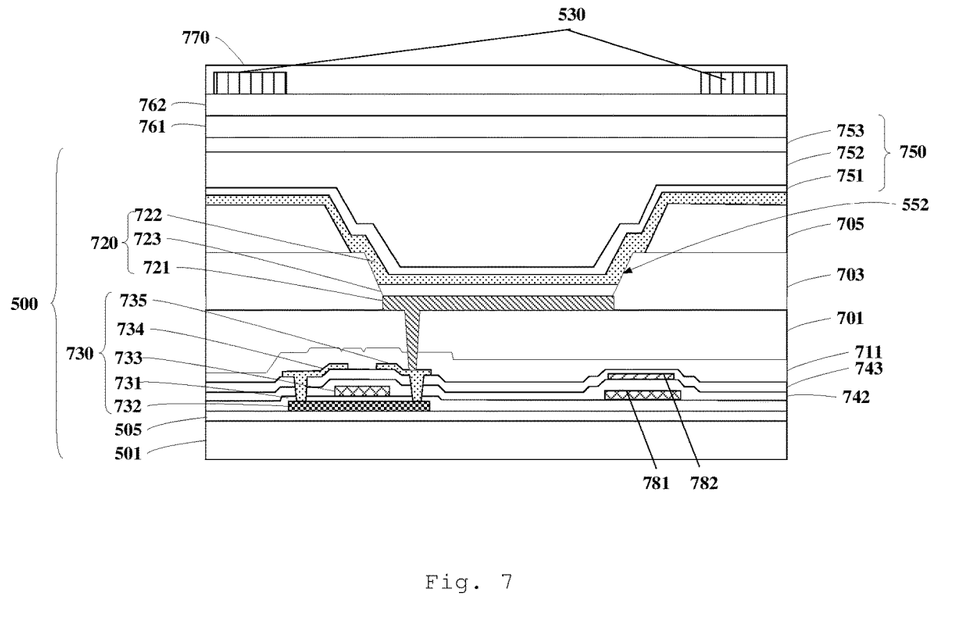
FIG. 7 is a cross-sectional view schematically showing a structure taken along a line E-E' in FIG. 6.

FIG. 7 is a cross-sectional view schematically showing a structure taken along a line E-E' in FIG. 6.

As shown in FIG. 7, the display substrate 500 comprises a base substrate 501. For example, the base substrate comprises a glass substrate, a resin substrate, or the like.

As shown in FIG. 7, the display substrate 500 further comprises a device structure layer on a side of the base substrate 501. The device structure layer comprises a plurality of transistors 730. For example, the transistor 730 comprises an active layer 732 on the base substrate 501, a first insulating layer 731 covering the active layer 732, a gate 733 on a side of the first insulating layer 731 away from the base substrate 501, a second insulating layer 742 covering the gate 733, an interlayer dielectric layer 743 covering the second insulating layer 742, and a source 734 and a drain 735 on a side of the interlayer dielectric layer 743 away from the base substrate 501. In some embodiments, the display substrate 500 may further comprise a buffer layer 505 between the base substrate 501 and the active layer 732. For example, the active layer 732 is located on the buffer layer 505. The source 734 and the drain 735 each are electrically connected to the active layer 732. For example, materials of the first insulating layer 731, the second insulating layer 742, and the interlayer dielectric layer 743 comprise silicon oxide, silicon nitride, or the like. Materials of the gate 733, the source 734, and the drain 735 comprise a metal material. A material of the active layer 732 comprises semiconductor materials such as amorphous silicon or polysilicon.

In some embodiments, the device structure layer further comprises a capacitor between the interlayer dielectric layer 743 and the base substrate 501. The capacitor comprises a first capacitor electrode 781 on a side of the first insulating layer 731 away from the base substrate 501 and a second capacitor electrode 782 on a side of the second insulating layer 742 away from the first capacitor electrode 781. The first capacitor electrode 781 may be in the same layer as and separated from the gate 733. The second insulating layer 742 covers the first capacitor electrode 781, and the interlayer dielectric layer 743 covers the second capacitor electrode 782.

As shown in FIG. 7, the display substrate 500 further comprises a planarization layer 701 on a side of the device structure layer away from the base substrate 501. For example, a material of the planarization layer 701 comprises an insulating material (e.g., an organic insulating material such as polyimide).

As shown in FIG. 7, the display substrate 500 further comprise a plurality of third electrodes 721 on a side of the planarization layer 701 away from the device structure layer. For example, the third electrode 721 is an anode. The plurality of third electrodes are in the display area 570. The plurality of third electrodes 721 are electrically connected to different transistors in the plurality of transistors 730.

As shown in FIG. 7, the display substrate 500 further comprises a pixel defining layer 703 on a side of the planarization layer 701 away from the device structure layer. The pixel defining layer 703 has a plurality of openings 552. A part of the pixel defining layer 703 is in the display area, and another part of the pixel defining layer 703 is in at least a portion of the special-shaped area. The opening 552 of the pixel defining layer 703 in the display area exposes at least a portion of the third electrode 721, and the opening 552 of the pixel defining layer 703 in the at least a portion of the special-shaped area exposes a part of the planarization layer 701.

As shown in FIG. 7, the display substrate 500 further comprises a functional layer 723 in each of the plurality of openings 552 of the pixel defining layer 703. For example, the functional layer 723 is a light emitting layer.

As shown in FIG. 7, the display substrate 500 further comprises a fourth electrode 722 on a side of the functional layer 723 away from the base substrate 501. For example, the fourth electrode 722 is a cathode.

In some embodiments, as shown in FIG. 7, the display substrate 500 may further comprise a spacer layer 705 on a side of the pixel defining layer 703 away from the base substrate 501. The fourth electrode 722 covers the spacer layer 705. For example, a material of the spacer layer 705 comprises an inorganic insulating material or an organic insulating material.

As shown in FIG. 7, the display substrate 500 further comprises an encapsulation layer 750 on a side of the fourth electrode 722 away from the functional layer 723. For example, the encapsulation layer 750 comprises a first inorganic encapsulation layer 751 on a side of the fourth electrode 722 away from the base substrate 501, an organic encapsulation layer 752 on a side of the first inorganic encapsulation layer 751 away from the base substrate 501, and a second inorganic encapsulation layer 753 on a side of the organic encapsulation layer 752 away from the base substrate 501. For example, a material of the first inorganic encapsulation layer 751 comprises silicon nitride or the like, a material of the organic encapsulation layer 752 comprises PMMA (poly(methyl methacrylate), also referred to as acrylic) or the like, and a material of the second inorganic encapsulation layer 753 comprises silicon nitride or the like. The touch electrode layer is located on a side of the encapsulation layer 750 away from the base substrate 501.

In some embodiments, as shown in FIG. 7, the display substrate 500 may further comprise a barrier layer 761 on a side of the encapsulation layer 750 away from the base substrate 501. For example, a material of the barrier layer 761 comprises an inorganic insulating material.

In some embodiments, as shown in FIG. 7, the display substrate 500 may further comprise a third insulating layer 762 on a side of the barrier layer 761 away from the base substrate 501. For example, a material of the third insulating layer 762 comprises silicon nitride, silicon oxide, silicon oxynitride, or the like. For example, as shown in FIG. 7, the first electrode line 530 of the first electrode 511 of the touch electrode layer (or the second electrode line of the second electrode 512) is located on the third insulating layer 762.

As mentioned above, the orthographic projection of the first electrode line 530 of each of the first electrodes 511 on the base substrate 501 is between orthographic projections of different openings 552 of the pixel defining layer 703 on the base substrate 501, and the orthographic projection of the second electrode line of each of the second electrodes 512 on the base substrate 501 is between orthographic projections of different openings 552 of the pixel defining layer 703 on the base substrate 501. In this way, it is possible to avoid as much as possible that the light emission of the sub-pixels is blocked by the first electrode line or the second electrode line.

Figure 8:
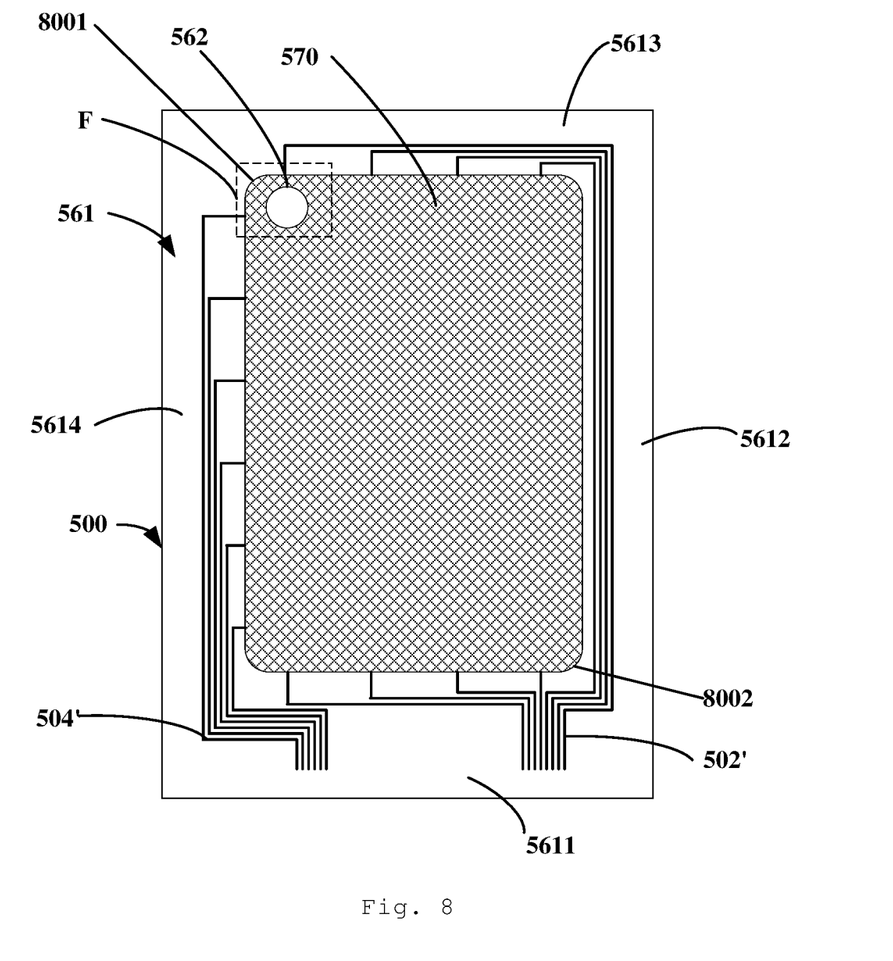
FIG. 8 is a top view schematically showing a touch display panel according to another embodiment of the present disclosure.

FIG. 8 is a top view schematically showing a touch display panel according to another embodiment of the present disclosure.

As shown in FIG. 8, the first non-display area 561 comprises a first sub-area 5611 on a side of the display area 570, a second sub-area 5612 on a side of the display area 570 adjacent to the first sub-area 5611, a third sub-area 5613 on a side of the display area 570 opposite to the first sub-area 5611 and a fourth sub-area 5614 on a side of the display area 570 opposite to the second sub-area 5612. As shown in FIG. 8, the third sub-area 5613 and the fourth sub-area 5614 form a first included angle 8001, the first sub-area 5611 and the second sub-area 5612 form a second included angle 8002, and a distance between the second special-shaped area 562 and the first included angle 8001 is less than a distance between the second special-shaped area 562 and the second included angle 8002. In other words, the second special-shaped area 562 is closer to a position of the first included angle formed by the third sub-area 5613 and the fourth sub-area 5614 than the first sub-area 5611 and the second sub-area 5612.

In some embodiments, as shown in FIG. 8, the touch display panel further comprises a plurality of first wires (e.g., transmitting wires) 502' electrically connected to a plurality of columns of first electrodes in a one-to-one correspondence. The plurality of first wires 502' are located at least in the second sub-area 5612 and the third sub-area 5613. For example, the plurality of first wires 502' may also be located in the first sub-area 5611. A first wire in the plurality of first wires 502' that corresponds to a column of first electrodes closest to the second sub-area 5612 is closest to the display area 570. For example, the plurality of first wires 502' in the third sub-area 5613 may be sequentially accessed into a corresponding column of first electrodes according to the order from a first column of first electrodes closest to the second sub-area 5612 to a last column of first electrodes closest to the fourth sub-area 5614. Therefore, in a direction from the second sub-area 5612 to the fourth sub-area 5614, the number of the plurality of first wires 502' gradually decreases.

In some embodiments, as shown in FIG. 8, the touch display panel further comprises a plurality of second wires (e.g., receiving wires) 504' electrically connected to a plurality of rows of second electrodes 512 in a one-to-one correspondence. The plurality of second wires 504' are located at least in the fourth sub-area 5614. For example, the plurality of second wires 504' may also be located in the first sub-area 5611. A second wire in the plurality of second wires 504' that corresponds to a row of second electrodes closest to the first sub-area 5611 is closest to the display area 570. For example, the plurality of second wires 504' in the fourth sub-area 5614 may be sequentially accessed into a corresponding row of second electrodes according to the order from a first row of second electrodes closest to the first sub-area 5611 to a last row of second electrodes closest to the third sub-area 5613. Therefore, in a direction from the first sub-area 5611 to the third sub-area 5613, the number of the plurality of second wires 504' gradually decreases.

In the above-described embodiments, the first wires 502' and the second wires 504' are arranged such that there are less first wires and second wires in the vicinity of the second special-shaped, so that there is a greater portion of the first electrode or the second electrode extending into the first non-display area in the vicinity of the second special-shaped area, thereby further enlarging an area of the incomplete electrode pattern caused by the special-shaped area as much as possible. In this way, it is possible to improve the completeness of these incomplete electrode patterns as much as possible, and provide the sensitivity of the touch panel.

In other words, the above-described embodiments may also be regarded as arranging the second special-shaped area (e.g., the cutout area) at a position in the display area adjacent to a portion of the first non-display area having the least first and second wires.

Figure 9:
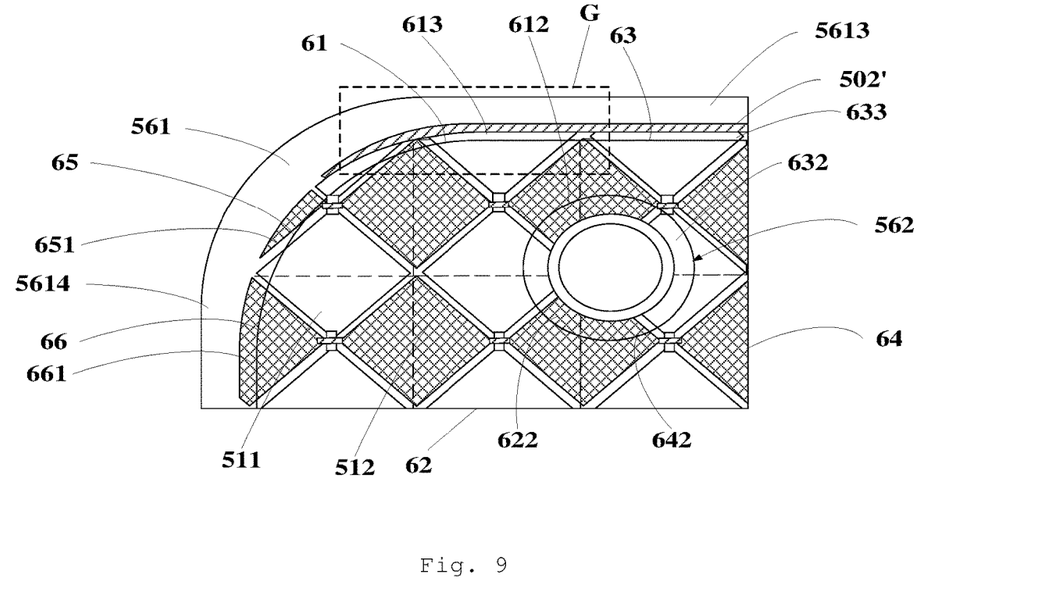
FIG. 9 is a partially enlarged view schematically showing a structure of a touch display panel at a block F in FIG. 8 according to an embodiment of the present disclosure.

FIG. 9 is a partially enlarged view schematically showing a structure of a touch display panel at a block F in FIG. 8 according to an embodiment of the present disclosure.

For example, as shown in FIG. 9, a plurality of first electrodes 511 and a plurality of second electrodes 512 constitute a plurality of electrode patterns. The plurality of electrode patterns may comprise: a first electrode pattern 61, a third electrode pattern 63, and a fifth electrode pattern 65 which are incomplete and adjacent to the special-shaped area (e.g., at least one of the first special-shaped area 561 or the second special-shaped area 562). The first electrode pattern 61, the third electrode pattern 63 and the fifth electrode pattern 65 are adjacent to the third sub-area 5613 and extend into the third sub-area 5613. In addition, the first electrode pattern 61 and the third electrode pattern 63 may also extend into the second special-shaped area 562.

For another example, as shown in FIG. 9, the plurality of electrode patterns may further comprise: a second electrode patterns 62, a fourth electrode pattern 64 and a sixth electrode pattern 66 which are incomplete and adjacent to the special-shaped area (e.g., at least one of the first special-shaped area 561 or the second special-shaped area 562) . The second electrode pattern 62 and the fourth electrode pattern 64 may respectively extend into the second special-shaped area 562. The sixth electrode pattern 66 is adjacent to the fourth sub-area 5614 and extends into the fourth sub-area 5614.

In some embodiments, a part of the touch electrode layer extending into the special-shaped area comprises a third portion corresponding to the second special-shaped area 562 and extending into at least one of the third sub-area 5613 or the fourth sub-area 5614.

For example, a third portion 613 of the first electrode pattern 61 extends into the third sub-area 5613, and a third portion 633 of the third electrode pattern 63 also extends into the third sub-area 5613. Therefore, the first electrode pattern 61 also has the third portion 613 extending into the third subarea 5613 in addition to having the second portion 612 extending into the second special-shaped area. The third electrode pattern 63 also has the third portion 633 extending into the third sub-area 5613 in addition to having the second portion 632 extending into the second special-shaped area. In this way, it is possible to further enlarge an area of these electrode patterns, thereby further improving the completeness of these electrode patterns.

Figure 10:
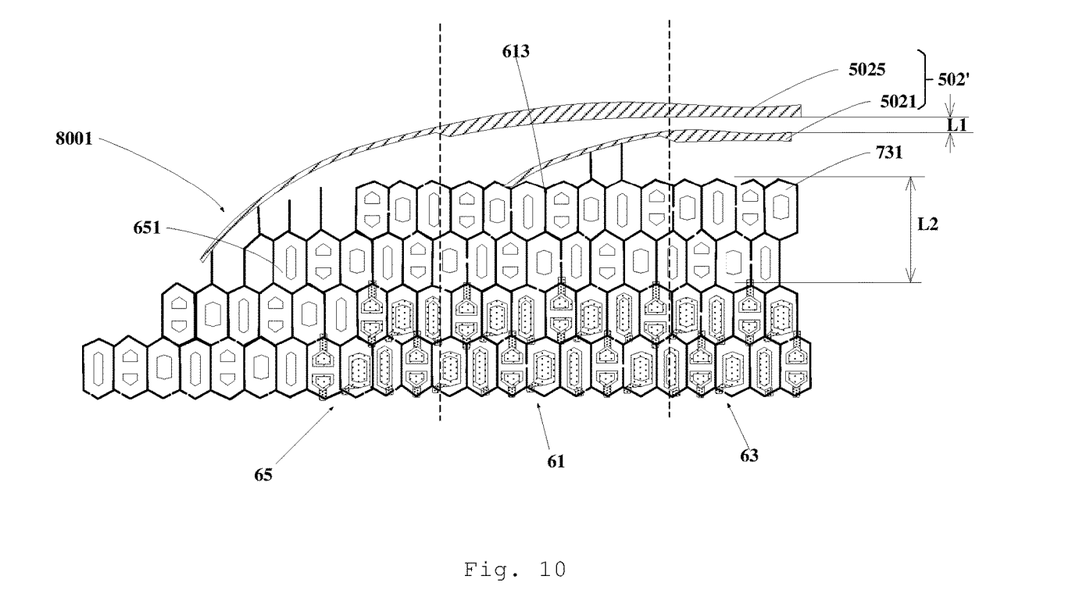
FIG. 10 is a partially enlarged view schematically showing a structure of a touch display panel at a block G in FIG. 9 according to an embodiment of the present disclosure.

FIG. 10 is a partially enlarged view schematically showing a structure of a touch display panel at a block G in FIG. 9 according to an embodiment of the present disclosure.

In some embodiments, a part that occupies a smallest area in the first wire 502' or the second wire 504' is at a position of the first included angle 8001 formed by the third sub-area 5613 and the fourth sub-area 5614. For example, as shown in FIG. 10, the first wire 5025 among the plurality of first wires 502' which is electrically connected to the fifth electrode pattern 65 is at a position of the above-described first angle. In this way, it is convenient for an area of a part of the fifth electrode pattern 65 that extends into the first non-display area 561 to be as large as possible, thereby improving the completeness of the electrode pattern.

In addition, as shown in FIG. 10, a part of the first wire 5025 above the fifth electrode pattern 65 is thinner, and when the first wire 5025 extends above the adjacent first electrode pattern 61, its width increases. A part of another first wire 5021 above the first electrode pattern 61 that is electrically connected to the first electrode pattern 61 is thinner.

In some embodiments, as shown in FIG. 10, a ratio between a distance L1 between adjacent first wires in the plurality of first wires that are in the third sub-area and a width L2 of a portion of the touch electrode layer (e.g., at least one of the first electrode pattern 61, the third electrode pattern 63 and the fifth electrode pattern 65) extending into the third sub-area is 0.03 to 0.17. This ratio may make the boundary space of the touch display panel be fully utilized as much as possible, thereby adequately expanding an effective touch area, and improving the touch performance of the second special-shaped area and the boundary.

In some embodiments, the extent of the fifth electrode pattern 65 extending toward the third sub-area 5613 is greater than the extent of the first electrode pattern 61 extending toward the third sub-area 5613; the extent of the first electrode pattern 61 extending toward the third sub-area 5613 is greater than the extent of the third electrode pattern 63 extending toward the third sub-area 5613. For example, the fifth electrode pattern 65 extends 300 micrometers to 380 micrometers (e.g., 354 micrometers) toward the third sub-area 5613, the first electrode pattern 61 extends 200 micrometers to 250 micrometers (e.g., 231 micrometers) toward the third sub-area 5613, and the electrode pattern 63 extends 100 micrometers to 180 micrometers (e.g., 147 micrometers) toward the third sub-area 5613.

In some embodiments, the distance L1 between the adjacent first wires in the third sub-area is 12 micrometers to 24 micrometers.

According to some embodiments of the present disclosure, a touch display device is provided. The touch display device comprises the touch display panel as described above. For example, the touch display device may be a device with touch and display functions, such as a cell phone, a tablet computer, a touch screen, or a navigator.

Figure 11:
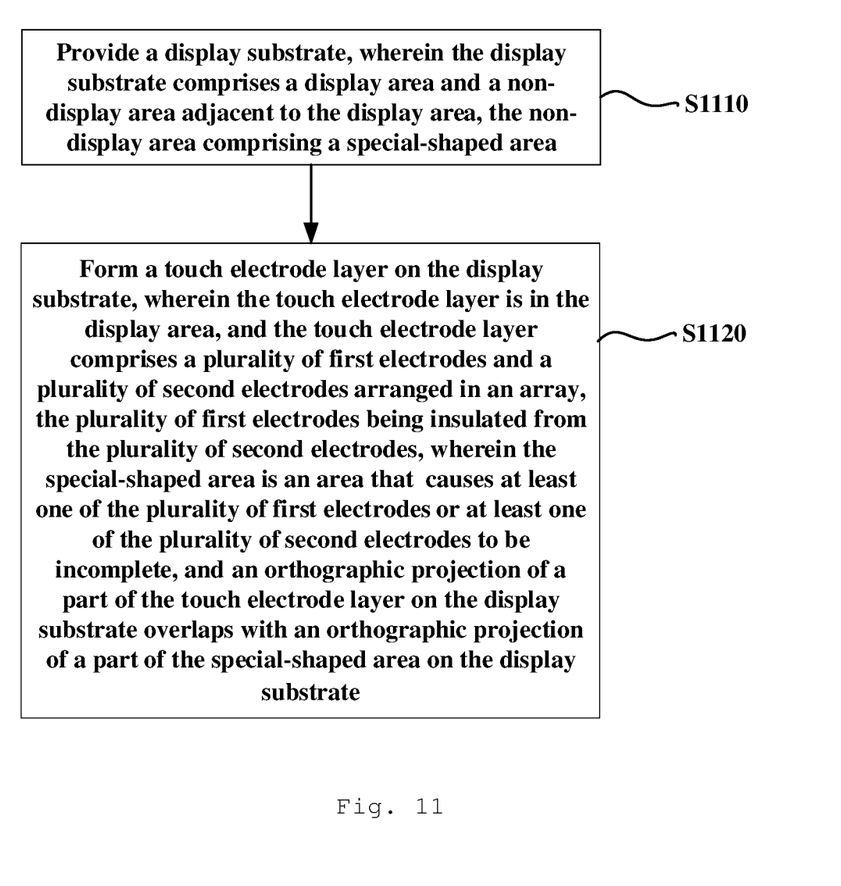
FIG. 11 is a flowchart schematically showing a manufacturing method for a touch display panel according to an embodiment of the present disclosure.

FIG. 11 is a flowchart schematically showing a manufacturing method for a touch display panel according to an embodiment of the present disclosure. As shown in FIG. 11, the manufacturing method comprises steps S1110 to S1120.

At step S1110, a display substrate is provided. The display substrate comprises a display area and a non-display area adjacent to the display area. The non-display area comprises a special-shaped area.

At step S1120, a touch electrode layer is formed on the display substrate. The touch electrode layer is in the display area. The touch electrode layer comprises a plurality of first electrodes and a plurality of second electrodes arranged in an array. The plurality of first electrodes are insulated from the plurality of second electrodes. The special-shaped area described above is an area that causes at least one of the plurality of first electrodes or at least one of the plurality of second electrodes to be incomplete. A part of the touch electrode layer extends into the special-shaped area. An orthographic projection of the part of the touch electrode layer on the display substrate overlaps with an orthographic projection of a part of the special-shaped area on the display substrate.

So far, the manufacturing method for the touch display panel according to some embodiments of the present disclosure is provided. In the manufacturing method, a part of the touch electrode layer is extended into the special-shaped area, so that it is possible to increase an area of the incomplete electrode pattern, and improve the completeness of the incomplete electrode pattern, thereby improving the touch performance of the touch display panel in the vicinity of the special-shaped area.

Hereto, various embodiments of the present disclosure have been described in detail. Some details well known in the art are not described to avoid obscuring the concept of the present disclosure. According to the above-described description, those skilled in the art would fully know how to implement the technical solutions disclosed herein.

Although some specific embodiments of the present disclosure have been described in detail by way of examples, those skilled in the art should understand that the above-described examples are only for the purpose of illustration and are not intended to limit the scope of the present disclosure. It should be understood by those skilled in the art that modifications to the above-described embodiments or equivalently substitution of part of the technical features may be made without departing from the scope and spirit of the present disclosure. The scope of the present disclosure is defined by the appended claims.

What is claimed is:

1. A touch display panel, comprising:
a display substrate comprising a display area and a non-display area adjacent to the display area, wherein the non-display area comprises a special-shaped area, and the display substrate comprises:
a base substrate;
a device structure layer on a side of the base substrate and comprising a plurality of transistors;
a planarization layer on a side of the device structure layer away from the base substrate;
a plurality of third electrodes on a side of the planarization layer away from the device structure layer, wherein the plurality of third electrodes are in the display area, and the plurality of third electrodes are electrically connected to different transistors in the plurality of transistors;
a pixel defining layer on a side of the planarization layer away from the device structure layer, wherein the pixel defining layer has a plurality of openings, the pixel defining layer is in the display area and at least a portion of the special-sharped area, one of the plurality of openings of the pixel defining layer in the display area exposes at least a portion of at least one of the plurality of third electrodes, and one of the plurality of openings of the pixel defining layer in the at least a portion of the special-shaped area exposes a part of the planarization layer; and
a touch electrode layer on the display substrate and located in the display area, wherein the touch electrode layer comprises a plurality of first electrodes and a plurality of second electrodes arranged in an array, the plurality of first electrodes being insulated from the plurality of second electrodes, wherein the special-shaped area is an area that causes at least one of the plurality of first electrodes or at least one of the plurality of second electrodes to be incomplete, an orthographic projection of a part of the touch electrode layer on the display substrate overlaps with an orthographic projection of a part of the special-shaped area on the display substrate, each of the plurality of first electrodes comprises a first electrode line, each of the plurality of second electrodes comprises a second electrode line, and the part of the touch electrode layer comprises at least one of a part of the first electrode line extending into the special-shaped area or a part of the second electrode line extending into the special-shaped area.

2. The touch display panel according to claim 1, wherein:
the non-display area comprises a first non-display area on at least one side of the display area, and the special-shaped area comprises a first special-shaped area in the first non-display area;
wherein the part of the touch electrode layer comprises a first portion extending into the first special-shaped area, an orthographic projection of the first portion on the display substrate overlapping with an orthographic projection of a part of the first special-shaped area on the display substrate.

3. The touch display panel according to claim 1, wherein:
the non-display area comprises a second non-display area inside the display area, and the special-shaped area comprises a second special-shaped area in the second non-display area;
wherein the part of the touch electrode layer comprises a second portion extending into the second special-shaped area, an orthographic projection of the second portion on the display substrate overlapping with an orthographic projection of a part of the second special-shaped area on the display substrate.

4. The touch display panel according to claim 2, wherein the first special-shaped area is located at an arc-shaped corner portion of the display substrate.

5. The touch display panel according to claim 3, wherein the second special-shaped area comprises a through hole that penetrates through the display substrate or a blind hole that does not penetrate through the display substrate.

6. The touch display panel according to claim 1, wherein the display substrate further comprises:
a functional layer in each of the plurality of openings of the pixel defining layer;
a fourth electrode on a side of the functional layer away from the base substrate; and
an encapsulation layer on a side of the fourth electrode away from the functional layer;
wherein the touch electrode layer is on a side of the encapsulation layer away from the base substrate.

7. The touch display panel according to claim 6, wherein:
an orthographic projection of the first electrode line on the base substrate is between orthographic projections of different openings of the pixel defining layer on the base substrate; and
an orthographic projection of the second electrode line on the base substrate is between orthographic projections of different openings of the pixel defining layer on the base substrate.

8. The touch display panel according to claim 2, wherein:
the plurality of first electrodes comprise a plurality of columns of first electrodes arranged along a first direction, wherein adjacent first electrodes in each column of the plurality of columns of first electrodes are electrically connected; and
the plurality of second electrodes comprise a plurality of rows of second electrodes arranged along a second direction, wherein adjacent second electrodes in each row of the plurality of rows of second electrodes are electrically connected;

wherein the first direction intersects with the second direction.

9. The touch display panel according to claim 8, wherein:
the first non-display area comprises a first sub-area on a side of the display area, a second sub-area on a side of the display area adjacent to the first sub-area, a third sub-area on a side of the display area opposite to the first sub-area and a fourth sub-area on a side of the display area opposite to the second sub-area,
wherein the third sub-area and the fourth sub-area form a first included angle, the first sub-area and the second sub-area form a second included angle, and a distance between the second special-shaped area and the first included angle is less than a distance between the second special-shaped area and the second included angle.

10. The touch display panel according to claim 9, further comprising:
a plurality of first wires electrically connected to the plurality of columns of first electrodes in a one-to-one correspondence and located at least in the second sub-area and the third sub-area, wherein a first wire in the plurality of first wires that corresponds to a column of first electrodes closest to the second sub-area is closest to the display area; and
a plurality of second wires electrically connected to the plurality of rows of second electrodes in a one-to-one correspondence and located at least in the fourth sub-area, wherein a second wire in the plurality of second wires that corresponds to a row of second electrodes closest to the first sub-area is closest to the display area.

11. The touch display panel according to claim 9, wherein a part that occupies a smallest area in the plurality of first wires or the plurality of second wires is at a position of the first included angle.

12. The touch display panel according to claim 9, wherein:
the plurality of first electrodes and the plurality of second electrodes constitute a plurality of electrode patterns, and the plurality of electrode patterns comprises a first electrode pattern, a third electrode pattern and a fifth electrode pattern which are incomplete and adjacent to the special-shaped area.

13. The touch display panel according to claim 12, wherein:
a ratio between a distance between adjacent first wires in the plurality of first wires that are in the third sub-area and a width of a portion of at least one of the first electrode pattern, the third electrode pattern, or the fifth electrode pattern extending into the third sub-area is 0.03 to 0.17.

14. A touch display device, comprising: the touch display panel according to claim 1.

15. A manufacturing method for a touch display panel, comprising:
providing a display substrate, wherein the display substrate comprises a display area and a non-display area adjacent to the display area, the non-display area comprising a special-shaped area, and the display substrate comprising:
a base substrate;
a device structure layer on a side of the base substrate and comprising a plurality of transistors;
a planarization layer on a side of the device structure layer away from the base substrate;
a plurality of third electrodes on a side of the planarization layer away from the device structure layer, wherein the plurality of third electrodes are in the display area, and the plurality of third electrodes are electrically connected to different transistors in the plurality of transistors;
a pixel defining layer on a side of the planarization layer away from the device structure layer, wherein the pixel defining layer has a plurality of openings, the pixel defining layer is in the display area and at least a portion of the special-shaped area, one of the plurality of openings of the pixel defining layer in the display area exposes at least a portion of at least one of the plurality of third electrodes, and one of the plurality of openings of the pixel defining layer in the at least a portion of the special-shaped area exposes a part of the planarization layer; and
forming a touch electrode layer on the display substrate, wherein the touch electrode layer is in the display area, and the touch electrode layer comprises a plurality of first electrodes and a plurality of second electrodes arranged in an array, the plurality of first electrodes being insulated from the plurality of second electrodes, wherein the special-shaped area is an area that causes at least one of the plurality of first electrodes or at least one of the plurality of second electrodes to be incomplete, an orthographic projection of a part of the touch electrode layer on the display substrate overlaps with an orthographic projection of a part of the special-shaped area on the display substrate, each of the plurality of first electrodes comprises a first electrode line, each of the plurality of second electrodes comprises a second electrode line, and the part of the touch electrode layer comprises at least one of a part of the first electrode line extending into the special-shaped area or a part of the second electrode line extending into the special-shaped area.

16. The touch display panel according to claim 12, wherein the first electrode pattern, the third electrode pattern, and the fifth electrode pattern are adjacent to the third sub-area and extend into the third sub-area, wherein the first electrode pattern extends 200 micrometers to 250 micrometers toward the third sub-area, the third electrode pattern extends 100 micrometers to 180 micrometers toward the third sub-area, and the fifth electrode pattern extends 300 micrometers to 380 micrometers toward the third sub-area.

* * * * *

UNITED STATES PATENT AND TRADEMARK OFFICE
CERTIFICATE OF CORRECTION

PATENT NO. : 11,789,573 B2
APPLICATION NO. : 17/298087
DATED : October 17, 2023
INVENTOR(S) : Yuanqi Zhang et al.

Page 1 of 1

It is certified that error appears in the above-identified patent and that said Letters Patent is hereby corrected as shown below:

In the Claims

Column 15, Line 48, Claim 1, delete "sharped" and insert -- shaped --

Signed and Sealed this
Fifth Day of December, 2023

Katherine Kelly Vidal
*Director of the United States Patent and Trademark Office*